US008120374B2

(12) United States Patent
Chang

(10) Patent No.: US 8,120,374 B2

(45) Date of Patent: Feb. 21, 2012

(54) INSPECTION CIRCUIT AND DISPLAY DEVICE THEREOF

(75) Inventor: Hsi-Ming Chang, Taoyuan County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 549 days.

(21) Appl. No.: 12/358,250

(22) Filed: Jan. 23, 2009

(65) Prior Publication Data

US 2010/0110324 A1 May 6, 2010

(30) Foreign Application Priority Data

Oct. 30, 2008 (TW) .............................. 97141740 A

(51) Int. Cl.
*G01R 31/26* (2006.01)

(52) U.S. Cl. ................................................ 324/760.01

(58) Field of Classification Search ....................... None
See application file for complete search history.

(56) References Cited

U.S. PATENT DOCUMENTS 7,821,285 B2 * 10/2010 Kawaura et al. ......... 324/760.01
2007/0296453 A1 12/2007 Ootaguro et al.
2008/0007504 A1 * 1/2008 Kawaura et al. ................ 345/89

FOREIGN PATENT DOCUMENTS

JP 2005189838 7/2005
JP 2007333823 A * 12/2007

* cited by examiner

*Primary Examiner* — Paresh Patel
(74) *Attorney, Agent, or Firm* — Winston Hsu; Scott Margo

(57) ABSTRACT

An inspection circuit is used for inspecting signal wires of a display area. The inspection circuit includes a shorting bar, plural first shorting switches, and plural second shorting switches. The plurality of the first and the second shorting switches are disposed at different sides of the display area for increasing space between each adjacent shorting switch so as to reduce coupling effect. In the inspection circuit, a first shorting switch is electrically connected between the shorting bar and first end of one signal wire, and a second shorting switch is electrically connected between the second end of that signal wire and second end of another signal wire.

10 Claims, 5 Drawing Sheets

INSPECTION CIRCUIT AND DISPLAY DEVICE THEREOF

BACKGROUND OF THE INVENTION

1. Field of the Invention

The present invention relates to an inspection circuit and a display device thereof, and more particularly, to an inspection circuit with shorting switches respectively disposed on different sides of the pixel area of the display device for reducing the cross-talk and the coupling effect.

2. Description of the Prior Art

Please refer to FIG. 1. FIG. 1 is a diagram illustrating a conventional Liquid Crystal Display (LCD) 100 during the inspection phase. The inspection type is 2G3D, which means all the gate lines are short-circuited to only two gate lines (2G), and all the data lines are short-circuited to only three data lines (3D). As shown in FIG. 1, during the inspection phase, the LCD 100 comprises an inspection circuit 140 and a pixel area (display area) 110.

The inspection circuit 140 is utilized for inspecting if there is any bad pixel in the pixel area 110. The inspection circuit 140 comprises two gate line shorting bars $GSL_A$ and $GSL_B$, three data line shorting bars $DSL_C$, $DSL_D$ and $DSL_E$, and five conducting pads GA, GB, C, D and E. The conducting pads GA, GB, C, D and E are respectively electrically connected to the gate shorting bar $GSL_A$, the gate shorting bar $GSL_B$, the data shorting bar $DSL_C$, the data shorting bar $DSL_D$, and the data shorting bar $DSL_E$.

The pixel are 110 comprises N gate lines (signal wires) $GL_1$~$GL_N$, M data lines (signal wires) $DL_1$~$DL_M$ and a plurality of pixels interwoven by the gate lines and the data lines. The gate lines $GL_1$~$GL_N$ are divided into two groups: an odd gate line group (for example, $GL_1$, $GL_3$, $GL_5$ and so on), and an even gate line group (for example, $GL_2$, $GL_4$, $GL_6$ and so on). The data lines $DL_1$~$DL_M$ are divided into three groups: a red data line group (for example, $DL_1$, $DL_4$, $DL_7$ and so on), a green data line group (for example, $DL_2$, $DL_5$, $DL_8$ and so on), and a blue data line group (for example, $DL_3$, $DL_6$, $DL_9$ and so on). Each gate line comprises a first end 1 and a second end 2. For instance, the gate line $GL_1$ comprises a first end 1 and a second end 2. Each data line comprises a first end 1 and second end 2. For instance, the data line $DL_1$ comprises a first end 1 and a second end 2.

Each pixel in the pixel area 110 comprises three sub-pixels (a red sub-pixel, a green sub-pixel, and a blue sub-pixel). As shown in FIG. 1, a red sub-pixel $PX_{11}$ is electrically connected through a pixel switch $SW_{P11}$ to the corresponding gate line and the corresponding red data line so as to receive the corresponding gate driving signal and the corresponding data driving signal for driving the red sub-pixel $PX_{11}$ (it means displaying red color). More particularly, a first end 1 of the pixel switch $SW_{P11}$ is electrically connected to the red data line $DL_1$, a second end 2 of the pixel switch $SW_{P11}$ is electrically connected to the red sub-pixel $PX_{11}$, and a control end C of the pixel switch $SW_{P11}$ is electrically connected to the gate line $GL_1$. When the LCD 100 is during the inspection phase, all the gate lines $GL_1$~$GL_N$ are respectively short-circuited with the two gate line shorting bars $GSL_A$, and $GSL_B$, and all the data lines $DL_1$~$DL_M$ are respectively short-circuited with the three data line shorting bars $DSL_C$, $DSL_D$, and $DSL_E$. The inspection signals are respectively inputted to the conducting pads GA, GB, C, D and E for inspecting if there is any bad pixel in the pixel area 110.

As shown in FIG. 1, after the inspection phase, a laser cut procedure is executed for cutting out the inspection circuit 140 from the LCD 100. After that the laser cut procedure, the gate driving circuit (signal driving circuit) 120 and the data driving circuit (signal driving circuit) 130 are respectively electrically connected to the corresponding conducting pads $P_{G1}$~$P_{GN}$ and $P_{D1}$~$P_{DM}$. Moreover, the output ends of the gate driving circuit 120 are respectively electrically connected through the conducting pads $P_{G1}$~$P_{GN}$ to the first ends 1 of the gate lines $GL_1$~$GL_N$ and the output ends of the data driving circuit 130 are respectively electrically connected through the conducting pads $P_{D1}$~$P_{DM}$ to the first ends 1 of the data lines $DL_1$~$DL_M$. In this way, the fabrication of the LCD 100 is done.

However, after the inspection phase, the conventional inspection circuit 140 has to be cut out from the LCD by laser procedure, which causes a higher cost and a great inconvenience.

SUMMARY OF THE INVENTION

The present invention provides an inspection circuit for inspecting a plurality of signal wires of a display area. Each signal wire has a first end for electrically connecting to a signal driving circuit and a second end. The inspection circuit comprises a first signal wire shorting switch and a second signal wire shorting switch. The first signal wire shorting switch comprises a first end, electrically connected to the first end of a first signal wire of the plurality of the signal wires, a second end, and a third end for receiving a first control signal. The first signal wire shorting switch controls the first end of the first signal wire shorting switch electrically connecting to the second end of the first signal wire shorting switch according to the first control signal. The second signal wire shorting switch comprises a first end, electrically connected to the second end of the first signal wire of the plurality of the signal wires, a second end, electrically connected to the second end of a second signal wire of the plurality of the signal wires, and a third end for receiving a second control signal. The second signal wire shorting switch controls the first end of the second signal wire shorting switch electrically connecting to the second end of the second signal wire shorting switch according to the second control signal.

The present invention further provides an inspection circuit for inspecting a plurality of signal wires of a display area. Each of the plurality of the signal wires has a first end disposed on a first side of the display area for electrically connecting to a signal driving circuit and a second end disposed on a second side different from the first side of the display area. The inspection circuit comprises a shorting bar, a plurality of first signal wire shorting switches, and a plurality of second signal wire shorting switches. The shorting bar is disposed on the first side of the display area for receiving an inspection signal to inspect the plurality of the signal wires. The plurality of first signal wire shorting switches are disposed on the first side of the display area. Each of the plurality of the first signal wire shorting switches comprises a first end, electrically connected to the first end of a corresponding signal wire of the plurality of the signal wires, a second end, electrically connected to the shorting bar, and a third end for receiving a first control signal. The first signal wire shorting switch controls the first end of the first signal wire shorting switch electrically connecting to the second end of the first signal wire shorting switch according to the first control signal. The plurality of second signal wire shorting switches are disposed on the second side of the display area. Each of the plurality of the second signal wire shorting switches corresponds to a first signal wire shorting switch. Each of the plurality of the second signal wire shorting switches comprises a first end electrically connected to the second end of a signal wire electrically connected to a corresponding signal wire short switch of the plurality of the first signal wire shorting switches, a second end electrically connected to the second end of a corresponding signal wire of the plurality of the signal wires, which is different from the signal wire electrically connected to the first end of the second signal wire shorting switch, and a third end for receiving a second control signal. The second signal wire shorting switch controls the first end of the second signal wire shorting switch electrically connecting to the second end of the second signal wire shorting switch according to the second control signal.

The present invention further provides a display device. The display device comprises a display area, and an inspection circuit. The display area comprises a plurality of pixels, a plurality of pixel switches for driving the plurality of the pixels, and a plurality of signal wires for transmitting signals to the plurality of the pixel switches. Each of the plurality of the signal wires comprises a first end disposed on a first side of the display area and a second end disposed on a second side different from the first side of the display area. The inspection circuit comprises a shorting bar, a plurality of first signal wire shorting switches, and a plurality of second signal wire shorting switches. The shorting bar is disposed on the first side of the display area for receiving an inspection signal to inspect the plurality of the signal wires. The plurality of first signal wire shorting switches are disposed on the first side of the display area. Each of the plurality of the first signal wire shorting switches is electrically connected between the shorting bar and the first end of a corresponding signal wire of the plurality of the signal wires. The plurality of second signal wire shorting switches are disposed on the second side of the display area. Each of the plurality of the second signal wire shorting switches corresponds to one of the plurality of the first signal wire shorting switches. Each of the plurality of the second signal wire shorting switches is electrically connected between the second end of the signal wire electrically connected to the first signal wire shorting switch corresponding to the second signal wire switch and the second end of a signal wire corresponding to the second signal wire shorting switch. Each of the plurality of the second signal wire shorting switches is electrically connected between different signal wires of the plurality of the signal wires.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ." Also, the term "electrically connect" is intended to mean either an indirect or direct electrical connection. Accordingly, if one device is coupled to another device, that connection may be through a direct electrical connection, or through an indirect electrical connection via other devices and connections.

Figure 1:
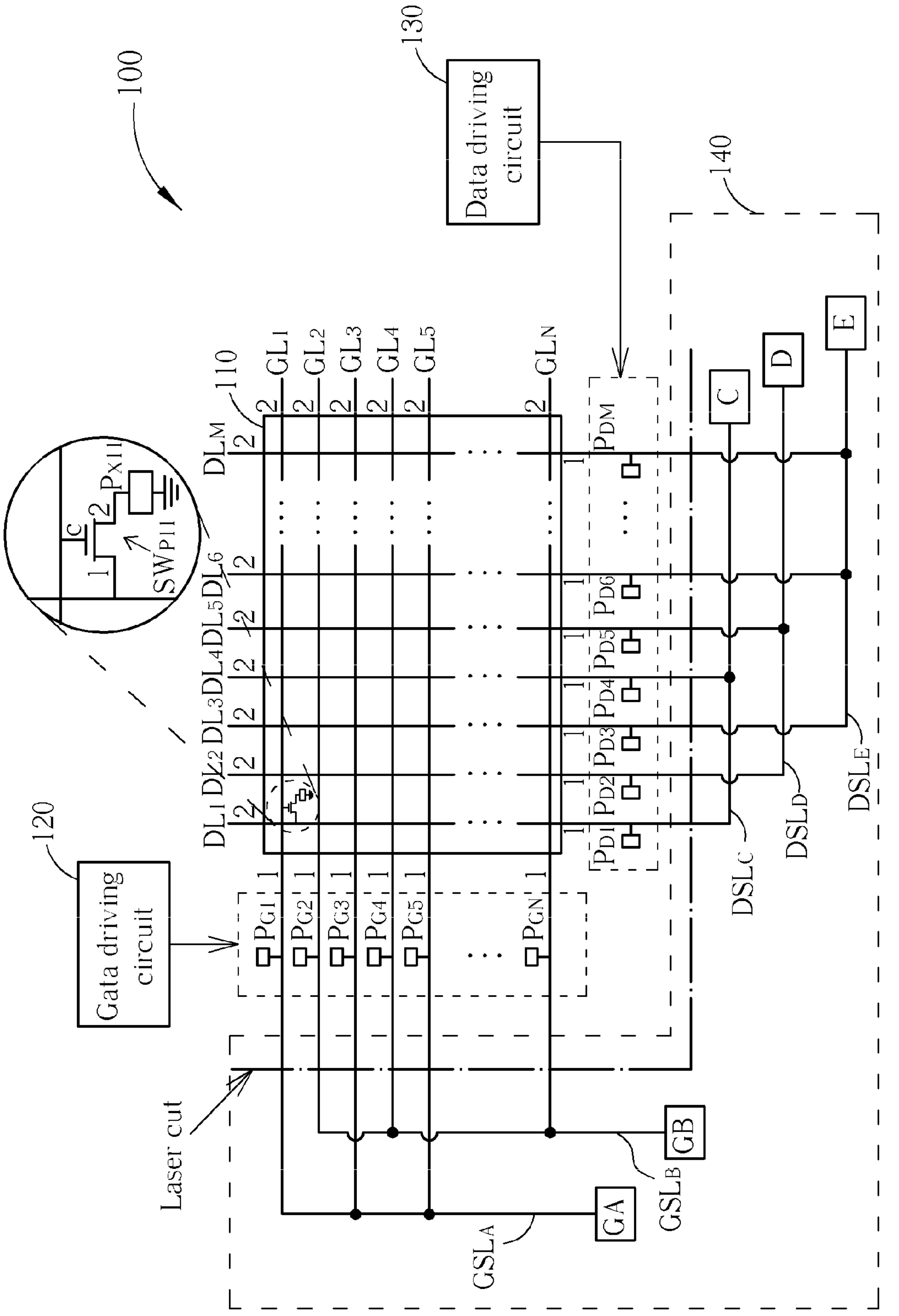
FIG. 1 PRIOR ART
FIG. 1 is a diagram illustrating a conventional LCD during the inspection phase.
Figure 2:
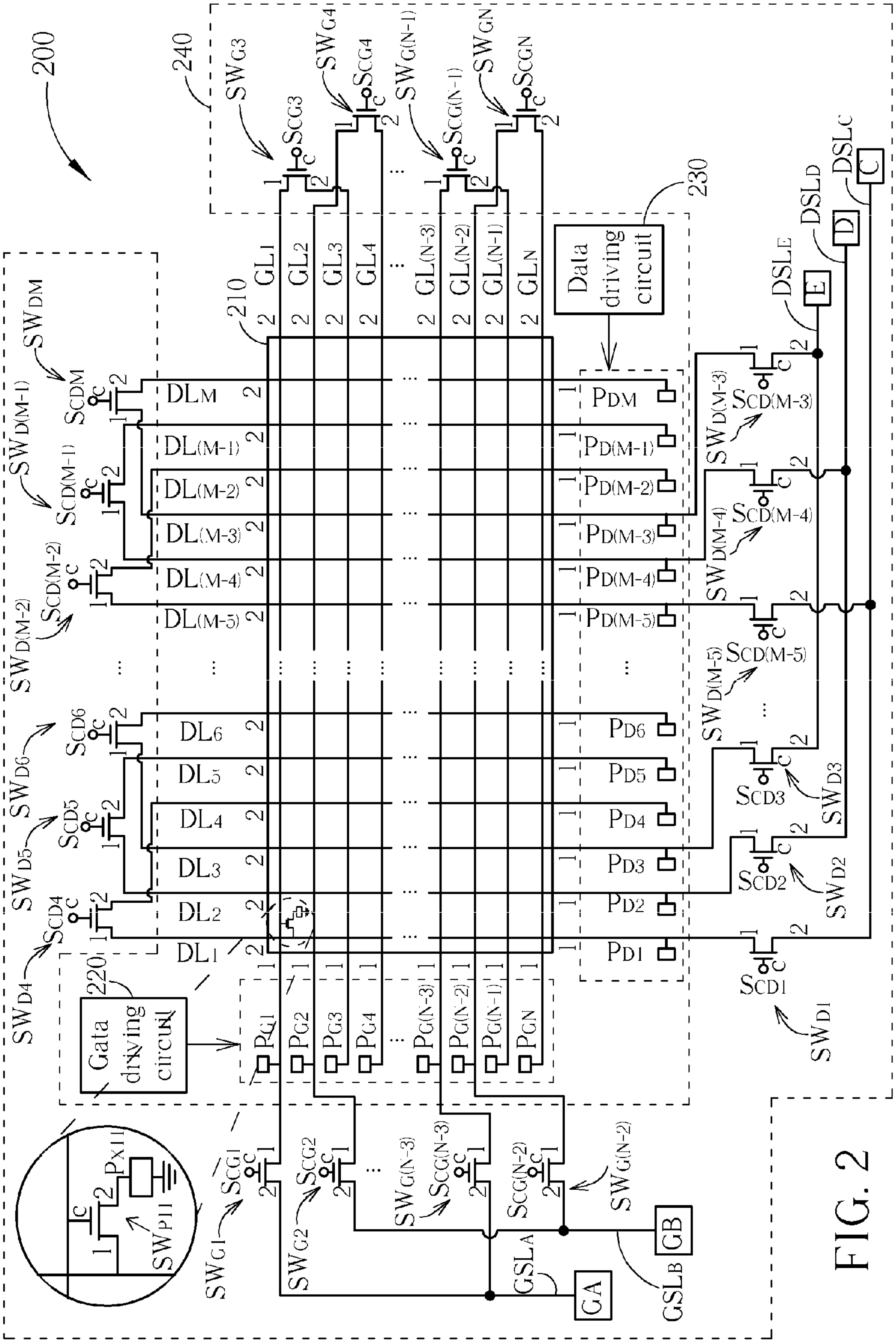
FIG. 2 is a diagram illustrating the LCD according to the first embodiment of the present invention during the inspection phase.

Please refer to FIG. 2. FIG. 2 is a diagram illustrating an LCD 200 (2G3D), during the inspection phase, according to the first embodiment of the present invention. The LCD 200 comprises an inspection circuit 240, and a pixel area (display area) 210.

The pixel area 210 comprises N gate lines (signal wires) $GL_1$~$GL_N$, M data lines (signal wires) $DL_1$~$DL_M$ and a plurality of pixels interwoven by the gate lines and the data lines. The gate lines $GL_1$~$GL_N$ are divided into two groups: an odd gate line group (for example, $GL_1$, $GL_3$, $GL_5$ and so on) and an even gate line group (for example, $GL_2$, $GL_4$, $GL_6$ and so on). The data lines $DL_1$~$DL_M$ are divided into three groups: a red data line group (for example, $DL_1$, $DL_4$, $DL_7$ and so on), a green data line group (for example, $DL_2$, $DL_5$, $DL_8$ and so on), and a blue data line group (for example, $DL_3$, $DL_6$, $DL_9$ and so on). Each gate line comprises a first end 1 and a second end 2. For instance, the gate line $GL_1$ comprises a first end 1 and a second end 2. Each data line comprises a first end 1 and a second end 2. For instance, the data line $DL_1$ comprises a first end 1 and a second end 2. Each pixel in the pixel area 210 comprises three sub-pixels (a red sub-pixel, a green sub-pixel, and a blue sub-pixel). As shown in FIG. 2, a red sub-pixel $PX_{11}$ is electrically connected through a pixel switch $SW_{P11}$ to the corresponding gate line and the corresponding red data line so as to receive the corresponding gate driving signal and the corresponding data driving signal for driving the red sub-pixel $PX_{11}$ (it means displaying red color). More particularly, a first end 1 of the pixel switch $SW_{P11}$ is electrically connected to the red data line $DL_1$, a second end 2 of the pixel switch $SW_{P11}$ is electrically connected to the red sub pixel $PX_{11}$, and a control end C of the pixel switch $SW_{P11}$ is electrically connected to the gate line $GL_1$.

The inspection circuit 240 comprises two gate line shorting bars $GSL_A$ and $GSL_B$, three data line shorting bars $DSL_C$, $DSL_D$ and $DSL_E$, five conducting pads GA, GB, C, D and E, N gate line shorting switches (signal wire shorting switches) $SW_{G1}$~$SW_{GN}$ and M data line shorting switches (signal wire shorting switches) $SW_{D1}$~$SW_{DM}$. As shown in FIG. 2, the gate line shorting bars $GSL_A$ and $GSL_B$ are disposed on the left side of the pixel area 210 and the data line shorting bars $DSL_C$, $DSL_D$ and $DSL_E$ are disposed on the bottom side of the pixel area 210. The conducting pads GA, GB, C, D and E are respectively electrically connected to the gate line shorting bar $GSL_A$, the gate line shorting bar $GSL_B$, the data line shorting bar $DSL_C$, the data line shorting bar $DSL_D$ and the data line shorting bar $DSL_E$.

In addition, the conducting pads $P_{G1}$~$P_{GN}$ are disposed on the left side of the pixel area 210 for electrically connecting the gate driving circuit (signal driving circuit) 220 to the gate lines $GL_1$~$GL_N$ after the inspection phase. More precisely, after the inspection phase, the gate driving circuit 220 is electrically connected to the corresponding conducting pads $P_{G1}$~$P_{GN}$ so as to electrically connect the output ends of the gate driving circuit 220 through the conducting pads $P_{G1}$~$P_{GN}$ to the first ends 1 of the gate lines $GL_1$~$GL_N$. The conducting pads $P_{D1}$~$P_{DM}$ are disposed on the bottom side of the pixel area 210 for electrically connecting the data driving circuit (signal driving circuit) 220 to the data lines $DL_1$~$DL_M$ after the inspection phase. More precisely, after the inspection phase, the data driving circuit 230 is electrically connected to the corresponding conducting pads $P_{D1}$~$P_{DM}$ so as to electrically connect the output ends of the data driving circuit 230 through the conducting pads to the first ends 1 of the data lines $DL_1$~$GL_M$.

All the gate line shorting switches $SW_{G1}$~$SW_{GN}$ and the data line shorting switches $SW_{D1}$~$SW_{DM}$ have the same structure. For instance, the gate line shorting switch $SW_{G1}$ comprises a first end 1, a second end 2, and a control end C. The gate line shorting switch $SW_{G1}$ controls the first end 1 of the gate line shorting switch $SW_{G1}$ electrically connecting to the second end 2 of the gate line shorting switch $SW_{G1}$ according to the control signal $S_{CG1}$ received on the control end C of the gate line shorting switch $SW_{G1}$. For instance, when the control signal $S_{CG1}$ turns on the gate line shorting switch $SW_{G1}$, the first end 1 of the gate line shorting switch $SW_{G1}$ is electrically connected to the second end 2 of the gate line shorting switch $SW_{G1}$. On the contrary, when the control signal $S_{CG1}$ turns off the gate line shorting switch $SW_{G1}$, the electrical connection between the first end 1 of the gate line shorting switch $SW_{G1}$ and the second end 2 of the gate line shorting switch $SW_{G1}$ is broken (open-circuited). The data line shorting switch $SW_{D1}$ comprises a first end 1, a second end 2, and a control end C. The data line shorting switch $SW_{D1}$ controls the first end 1 of the data line shorting switch $SW_{D1}$ electrically connecting to the second end 2 of the data line shorting switch $SW_{D1}$ according to the control signal $S_{CD1}$ received on the control end C of the data line shorting switch $S_{WD1}$. For instance, when the control signal $S_{CD1}$ turns on the data line shorting switch $SW_{D1}$, the first end 1 of the data line shorting switch $SW_{D1}$ is electrically connected to the second end 2 of the data line shorting switch $SW_{D1}$. On the contrary, when the control signal $S_{CD1}$ turns off the data line shorting switch $SW_{D1}$, the electrical connection between the first end 1 of the data line shorting switch $SW_{D1}$ and the second end 2 of the data line shorting switch $SW_{D1}$ is broken (open-circuited).

The gate line shorting switches $SW_{G1}$~$SW_{GN}$ are respectively disposed on the left side and the right side of the pixel area 210 for increasing available space between any two adjacent gate line shorting switches. That is, the gate line shorting switches $SW_{G1}$~$SW_{GN}$ are respectively disposed on the left side and the right side of the pixel area 210 so that the distance between any two adjacent gate line shorting switches becomes longer so as to reduce the cross-talk and the coupling effect.

The data line shorting switches $SW_{D1}$~$SW_{DM}$ are respectively disposed on the upper side and the bottom side of the pixel area 210 for increasing available space between any two adjacent data line shorting switches. That is, the data line shorting switches $SW_{D1}$~$SW_{GM}$ are respectively disposed on the upper side and the bottom side of the pixel area 210 so that the distance between any two adjacent data line shorting switches becomes longer so as to reduce the cross-talk and the coupling effect.

The gate line shorting switches $SW_{G1}$~$SW_{GN}$ of the inspection circuit 240 are divided into two groups: an odd gate shorting switch group (for example, $SW_{G1}$, $SW_{G3}$, $SW_{G5}$ and so on), and an even gate shorting switch group (for example, $SW_{G2}$, $SW_{G4}$, $SW_{G6}$ and so on). Any two adjacent gate lines in the same group are respectively named as the first gate line and the second gate line hereinafter. The gate line shorting switch corresponding to the first gate line and the gate line shorting switch corresponding to the second gate line are respectively disposed on the left side of the pixel area 210 and the right side of the pixel area 210. More particularly, the first end 1 of the gate line shorting switch corresponding to the first gate line is electrically connected to the first end 1 of the first gate line; the second end 2 of the gate line shorting switch corresponding to the first gate line is electrically connected to the corresponding odd/even gate line shorting bar; the first end 1 of the gate line shorting switch corresponding to the second gate line is electrically connected to the second end 2 of the first gate line; the second end 2 of the gate line shorting switch corresponding to the second gate line is electrically connected to the second end 2 of the second gate line. For example, among the odd gate line shorting switch group, the gate line shorting switches corresponding to the two adjacent odd gate lines $GL_1$ and $GL_3$ are the gate line shorting switches $SW_{G1}$ and $SW_{G3}$. The first end 1 of the gate line shorting switch $SW_{G1}$ is electrically connected to the first end 1 of the gate line $GL_1$; the second end 2 of the gate line shorting switch $SW_{G1}$ is electrically connected to the gate line shorting bar $GSL_A$. The first end 1 of the gate line shorting switch $SW_{G3}$ is electrically connected to the second end 2 of the gate line $GL_1$; the second end 2 of the gate line shorting switch $SW_{G3}$ is electrically connected to the second end 2 of the gate line $GL_3$. The rest gate line shorting switches of the odd gate line shorting switch group are disposed in the same way. The gate line short switches of the even gate line shorting switch group are disposed in the similar way as the gate line shorting switches of the odd gate line shorting switch group disposed and hereinafter will not be repeated again for brevity.

The data line shorting switches $SW_{D1}$~$SW_{DM}$ of the inspection circuit 240 are divided into three groups: a red data shorting switch group (for example, $SW_{D1}$, $SW_{D4}$, $SW_{D7}$ and so on), a green data shorting switch group (for example, $SW_{D2}$, $SW_{D5}$, $SW_{D8}$ and so on), and a blue data shorting switch group (for example, $SW_{D3}$, $SW_{D6}$, $SW_{D9}$ and so on). Any two adjacent data lines in the same group are respectively named as the first data line and the second data line in the following description. The data shorting switch corresponding to the first data line and the data line shorting switch corresponding to the second data line are respectively disposed on the upper side of the pixel area 210 and the bottom side of the pixel area 210. More particularly, the first end 1 of the data line shorting switch corresponding to the first data line is electrically connected to the first end 1 of the first data line; the second end 2 of the data line shorting switch corresponding to the first data line is electrically connected to the corresponding data line shorting bar $DSL_C$ or $DSL_D$ or $DSL_E$; the first end 1 of the data line shorting switch corresponding to the second data line is electrically connected to the second end 2 of the first data line; the second end 2 of the data line shorting switch corresponding to the second data line is electrically connected to the second end 2 of the second data line. For example, among the red data line shorting switch group, the data line shorting switches corresponding to the two adjacent red data lines $DL_1$ and $DL_4$ are the data line shorting switches $SW_{D1}$ and $SW_{D4}$. The first end 1 of the data line shorting switch $SW_{D1}$ is electrically connected to the first end 1 of the data line $DL_1$; the second end 2 of the data line shorting switch $SW_{D1}$ is electrically connected to the data line shorting bar $DSL_C$. The first end 1 of the data line shorting switch $SW_{D4}$ is electrically connected to the second end 2 of the data line $DL_1$; the second end 2 of the data line shorting switch $SW_{D4}$ is electrically connected to the second end 2 of the data line $DL_4$. The rest data line shorting switches of the red data line shorting switch group are disposed in the same way. The data line short switches of the green and the blue data line shorting switch groups are disposed in the similar way as the data line shorting switches of the red data line shorting switch group disposed and hereinafter will not be repeated again for brevity.

Figure 3:
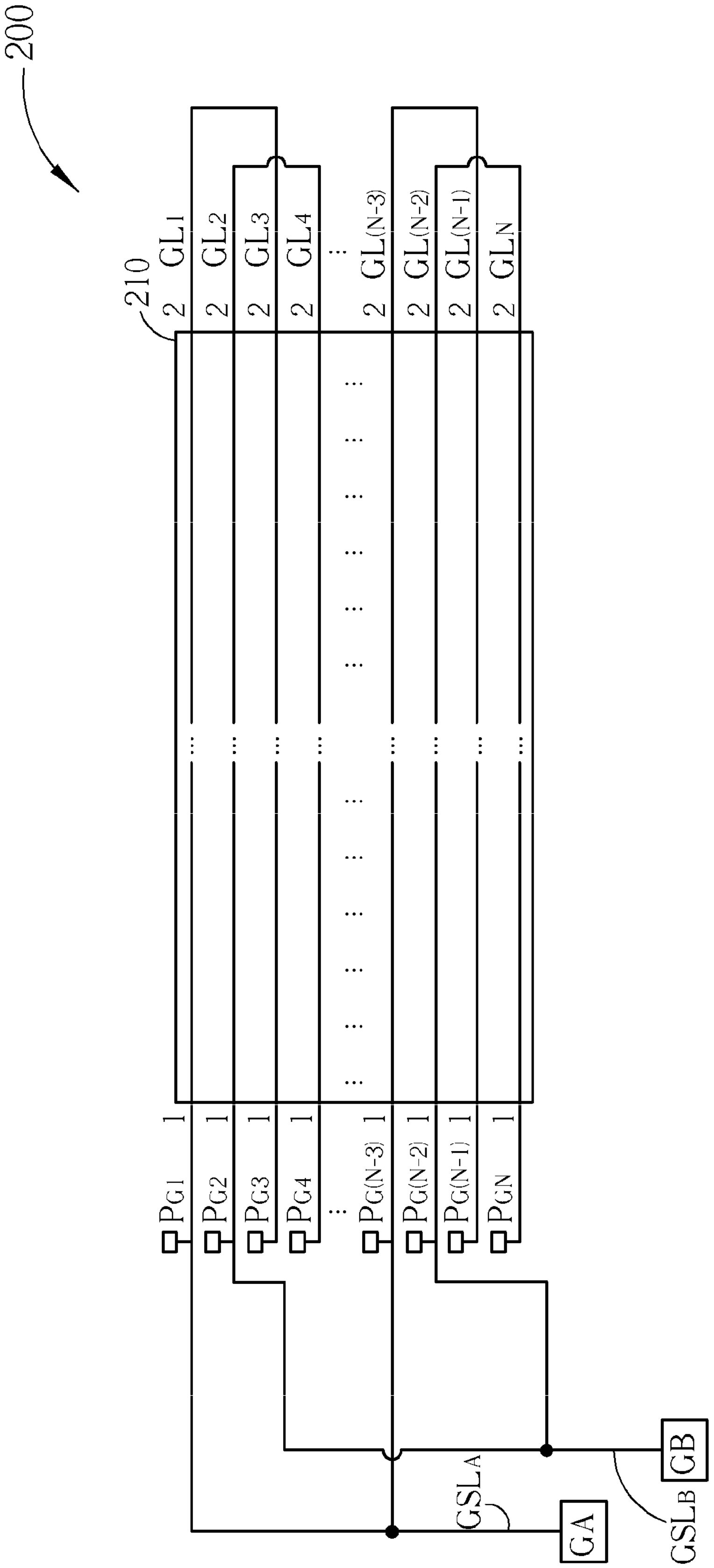
FIG. 3 is a diagram illustrating the gate lines being short-circuited during the inspection phase.

Please refer to FIG. 3. FIG. 3 is a diagram illustrating the gate lines being short-circuited during the inspection phase. As shown in FIG. 3, during the inspection phase, by means of the inspection circuit 240, all the gate line shorting switches $SW_{G1}$~$SW_{GN}$ are turned on so that all the gate lines are short-circuited to the corresponding gate line shorting bars as shown in FIG. 3. In this way, the inspection signals can be transmitted to the conducting pads GA and GB through the corresponding gate line shorting bars for inspecting all the gate lines $GL_1$~$GL_N$.

Figure 4:
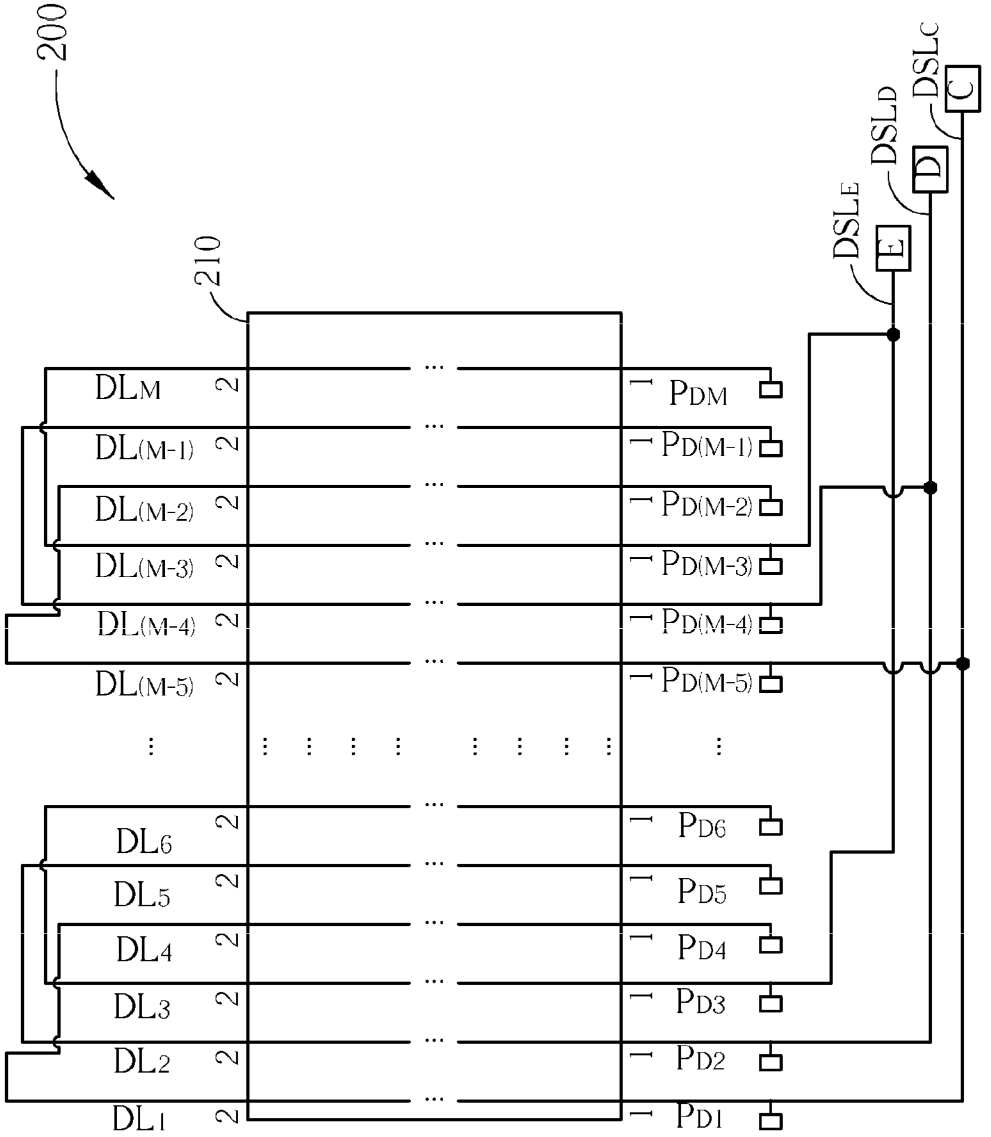
FIG. 4 is a diagram illustrating the data lines being short-circuited during the inspection phase.

Please refer to FIG. 4. FIG. 4 is a diagram illustrating the data lines being short-circuited during the inspection phase. As shown in FIG. 4, during the inspection phase, by means of the inspection circuit 240, all the data line shorting switches $SW_{D1}$~$SW_{DM}$ are turned on so that all the data lines are short-circuited to the corresponding data line shorting bars as shown in FIG. 4. In this way, the inspection signals can be transmitted to the conducting pads C, D and E through the corresponding data line shorting bars for inspecting all the data lines $DL_1$~$DL_M$.

In addition, the control ends C of each of the shorting switches $SW_{G1}$~$SW_{GN}$ and $SW_{D1}$~$SW_{DN}$ can be totally electrically connected together or partially electrically connected together as desired. However, it is required that all the shorting switches $SW_{G1}$~$SW_{GN}$ and $SW_{D1}$~$SW_{DM}$ have to be turned on during the inspection phase, and after the inspection phase, all the shorting switches $SW_{G1}$~$SW_{GN}$ and $SW_{D1}$~$SW_{DM}$ have to be turned off for preventing the LCD 200 from abnormal operation since the gate driving circuit 220 and the data driving circuit 230 are respectively electrically connected to the conducting pads $PG_1$~$PG_N$ and $PD_1$~$PD_M$.

Figure 5:
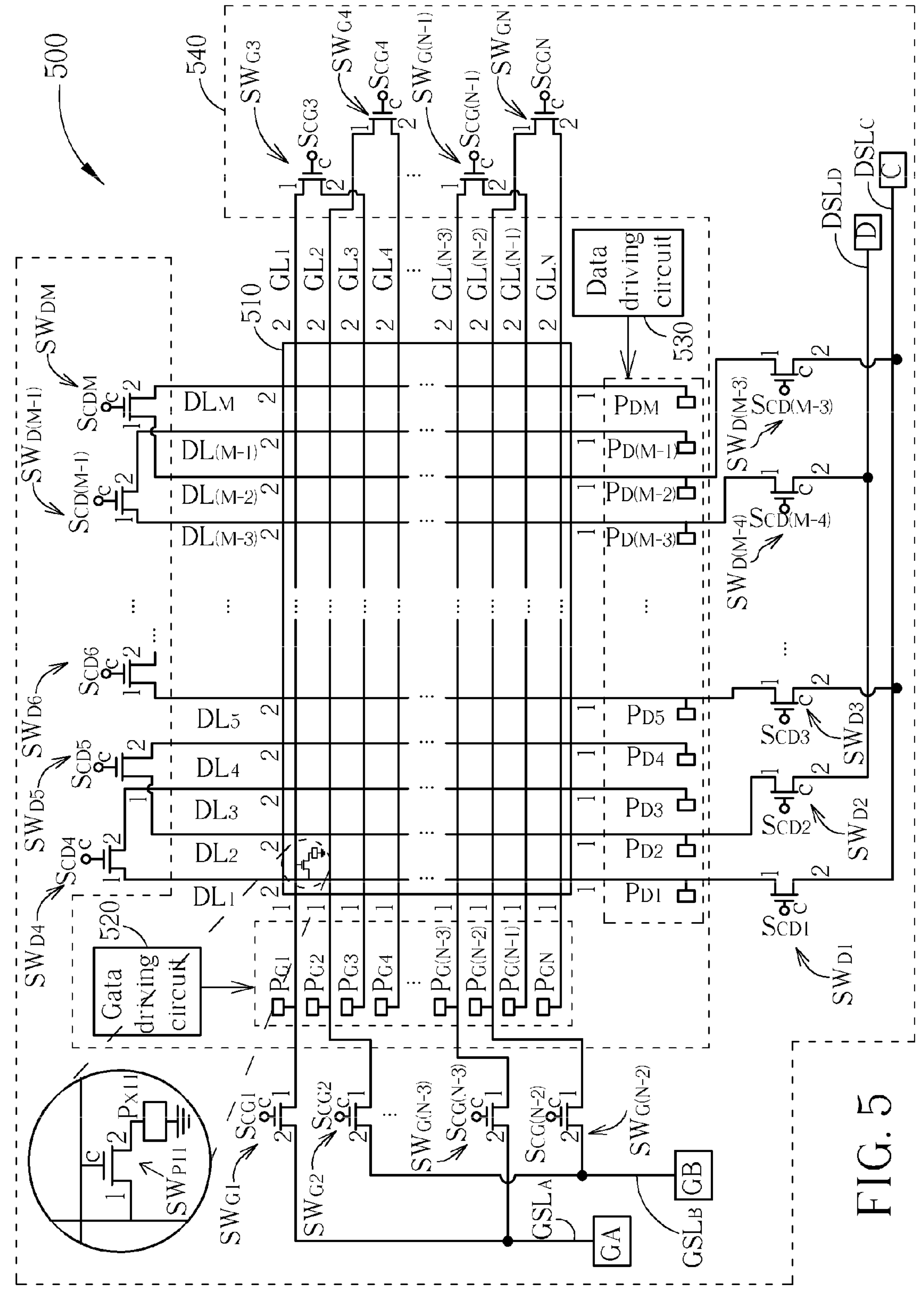
FIG. 5 is a diagram illustrating the LCD according to the second embodiment of the present invention.

Please refer to FIG. 5. FIG. 5 is a diagram illustrating the LCD 500 (2G2D) according to the second embodiment of the present invention. As shown in FIG. 5, the LCD 500 comprises an inspection circuit 540 and a pixel area (display area) 510. The inspection circuit 540 and the pixel area 510 in the LCD 500 are similar to the inspection circuit 240 and the pixel area 210 in the LCD 200. The only difference is that the inspection circuit 540 comprises two gate line shorting bars $GSL_A$ and $GSL_B$, two data line shorting bars $DSL_C$ and $DSL_D$, and four conducting pads GA, GB, C and D. Compared with the inspection circuit 240, only two data line shorting bars are utilized in the inspection circuit 540 for shorting-circuited function. The pixel area 510 is divided into groups according to the design of the shorting bars of the inspection circuit 540. The related operational principle is as described above and hereinafter will not be repeated again.

In conclusion, the inspection circuit provided by the present invention increases the space between any two adjacent shorting switches by disposing the shorting switches on the different sides of the pixel area. Meanwhile, the cross-talk and coupling effect between the shorting switches are reduced, causing a great convenience.

Those skilled in the art will readily observe that numerous modifications and alterations of the device and method may be made while retaining the teachings of the invention.

What is claimed is:

1. An inspection circuit for inspecting a plurality of signal wires of a display area, each signal wire having a first end for electrically connecting to a signal driving circuit and a second end, the inspection circuit comprising:

a first signal wire shorting switch, comprising:
  a first end, electrically connected to the first end of a first signal wire of the plurality of the signal wires;
  a second end; and
  a third end for receiving a first control signal;
  wherein the first signal wire shorting switch controls the first end of the first signal wire shorting switch electrically connecting to the second end of the first signal wire shorting switch according to the first control signal;
a second signal wire shorting switch, comprising:
  a first end, electrically connected to the second end of the first signal wire of the plurality of the signal wires;
  a second end, electrically connected to the second end of a second signal wire of the plurality of the signal wires; and
  a third end for receiving a second control signal;
  wherein the second signal wire shorting switch controls the first end of the second signal wire shorting switch electrically connecting to the second end of the second signal wire shorting switch according to the second control signal; and
a first shorting bar for receiving a first inspection signal, the first shorting bar being electrically connected to the second end of the first signal wire shorting switch;
wherein when the first shorting bar receives the first inspection signal, the first and the second control signals turn on the first and the second signal wire shorting switches respectively at the same time.

2. The inspection circuit of claim 1, further comprising:
a third signal wire shorting switch, comprising:
  a first end, electrically connected to the first end of a third signal wire of the plurality of the signal wires;
  a second end; and
  a third end for receiving a third control signal;
  wherein the third signal wire shorting switch controls the first end of the third signal wire shorting switch electrically connecting to the second end of the third signal wire shorting switch according to the third control signal,
a fourth signal wire shorting switch, comprising:
  a first end, electrically connected to the second end of the third signal wire;
  a second end, electrically connected to the second end of a fourth signal wire of the plurality of the signal wires; and
  a third end for receiving a fourth control signal;
  wherein the fourth signal wire shorting switch controls the first end of the fourth signal wire shorting switch electrically connecting to the second end of the fourth signal wire shorting switch according to the fourth control signal;
wherein the third signal wire and the fourth signal wire are different from the first signal wire and the second signal wire.

3. The inspection circuit of claim 2, further comprising:
a second shorting bar for receiving a second inspection signal, the second shorting bar being electrically connected to the second end of the third signal wire shorting switch.

4. The inspection circuit of claim 3, wherein when the second shorting bar receives the second inspection signal, the third and the fourth control signals turn on the third and the fourth signal wire shorting switches respectively.

5. The inspection circuit of claim 1, wherein the plurality of the signal wires is a plurality of gate lines and the signal driving circuit is a gate driving circuit.

6. The inspection circuit of claim 1, wherein the plurality of the signal wires is a plurality of data lines and the signal driving circuit is a data driving circuit.

7. An inspection circuit for inspecting a plurality of signal wires of a display area, each of the plurality of the signal wires having a first end disposed on a first side of the display area for electrically connecting to a signal driving circuit and a second end disposed on a second side different from the first side of the display area, the inspection circuit comprising:

a shorting bar, disposed on the first side of the display area for receiving an inspection signal to inspect the plurality of the signal wires;

a plurality of first signal wire shorting switches, disposed on the first side of the display area, each of the plurality of the first signal wire shorting switches comprising:

a first end, electrically connected to the first end of a corresponding signal wire of the plurality of the signal wires;

a second end, electrically connected to the shorting bar; and a third end for receiving a first control signal;

wherein the first signal wire shorting switch controls the first end of the first signal wire shorting switch electrically connecting to the second end of the first signal wire shorting switch according to the first control signal; and a plurality of second signal wire shorting switches, disposed on the second side of the display area, each of the plurality of the second signal wire shorting switches corresponding to a first signal wire shorting switch, and each of the plurality of the second signal wire shorting switches comprising:

a first end, electrically connected to the second end of a signal wire electrically connected to a corresponding signal wire short switch of the plurality of the first signal wire shorting switches;

a second end, electrically connected to the second end of a corresponding signal wire of the plurality of the signal wires, which is different from the signal wire electrically connected to the first end of the second signal wire shorting switch; and a third end for receiving a second control signal;

wherein the second signal wire shorting switch controls the first end of the second signal wire shorting switch electrically connecting to the second end of the second signal wire shorting switch according to the second control signal; and wherein when the shorting bar receives the inspection signal, the plurality of the first signal wire shorting switches and the plurality of the second signal wire shorting switches are turned on at the same time.

8. The inspection circuit of claim 7, wherein the plurality of the signal wires is a plurality of gate lines and the signal driving circuit is a gate driving circuit.

9. The inspection circuit of claim 7, wherein the plurality of the signal wires is a plurality of data lines and the signal driving circuit is a data driving circuit.

10. A display device, comprising:

a display area, comprising:

a plurality of pixels;

a plurality of pixel switches for driving the plurality of the pixels; and a plurality of signal wires for transmitting signals to the plurality of the pixel switches, each of the plurality of the signal wires comprising a first end disposed on a first side of the display area and a second end disposed on a second side different from the first side of the display area; and an inspection circuit, comprising:

a shorting bar, disposed on the first side of the display area for receiving an inspection signal to inspect the plurality of the signal wires;

a plurality of first signal wire shorting switches, disposed on the first side of the display area, each of the plurality of the first signal wire shorting switches being electrically connected between the shorting bar and the first end of a corresponding signal wire of the plurality of the signal wires; and a plurality of second signal wire shorting switches, disposed on the second side of the display area, each of the plurality of the second signal wire shorting switches corresponding to one of the plurality of the first signal wire shorting switches, and each of the plurality of the second signal wire shorting switches being electrically connected between the second end of the signal wire electrically connected to the first signal wire shorting switch corresponding to the second signal wire shorting switch and the second end of a signal wire corresponding to the second signal wire shorting switch;

wherein each of the plurality of the second signal wire shorting switches is electrically connected between different signal wires of the plurality of the signal wires; and wherein when the shorting bar receives the inspection signal, the plurality of the first signal wire shorting switches and the plurality of the second signal wire shorting switches are turned on at the same time.

* * * * *